United States Patent [19]
Rao

[11] Patent Number: 5,687,132
[45] Date of Patent: Nov. 11, 1997

[54] MULTIPLE-BANK MEMORY ARCHITECTURE AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 548,752

[22] Filed: Oct. 26, 1995

[51] Int. Cl.$^6$ ...................................... G11C 8/00
[52] U.S. Cl. ............... 365/230.03; 365/221; 365/230.04
[58] Field of Search ................ 365/230.03, 149, 365/221, 230.04

[56] References Cited

U.S. PATENT DOCUMENTS

| | | | |
|---|---|---|---|
| 4,893,281 | 1/1990 | Hashimoto | 365/230.06 |
| 4,987,559 | 1/1991 | Miyauchi et al. | 365/189.04 |
| 5,121,360 | 6/1992 | West et al. | 365/230.03 |
| 5,305,284 | 4/1994 | Iwase | 365/238.5 |
| 5,319,603 | 6/1994 | Watanabe et al. | 365/230.04 |
| 5,377,154 | 12/1994 | Takasugi | 365/221 |
| 5,390,139 | 2/1995 | Smith et al. | 365/230.03 |

*Primary Examiner*—Son T. Dinh
*Attorney, Agent, or Firm*—James J. Murphy

[57] ABSTRACT

A memory 20 is disclosed including a first column of memory cells including a conductive bitline 202 and a second column of memory cells also including a conductive bitline 202. A gate 203 is provided for selectively coupling the bitline 202 of the first column with the bitline 202 of the second column for transferring a bit of data from a selected cell of the first column to a selected cell of the second column.

30 Claims, 4 Drawing Sheets

MULTIPLE-BANK MEMORY ARCHITECTURE AND SYSTEMS AND METHODS USING THE SAME

TECHNICAL FIELD OF THE INVENTION

The present invention relates in general to electronic memories and in particular to multiple-bank memories and systems and methods using the same.

BACKGROUND OF THE INVENTION

A typical processing system with video/graphics display capability includes a central processing unit (CPU), a display controller coupled to the CPU by a CPU local bus (directly and/or through core logic), a system memory coupled to the CPU local bus through core logic, a frame buffer memory coupled to the display controller via a peripheral local bus (e.g., PCI bus), peripheral circuitry (e.g., clock drivers and signal converters, display driver circuitry), and a display unit.

The CPU is the system master and generally provides overall system control in con. unction with the software operating system. Among other things, the CPU communicates with the system memory, holding instructions and data necessary for program execution, normally through core logic. Typically, the core logic is two to seven chips, with one or more chips being "address intensive" and one or more other chips being "data path intensive." The CPU also, in response to user commands and program instructions, controls the contents of the graphics images to be displayed on the display unit by the display controller.

The display controller, which may be, for example, a video graphics architecture (VGA) controller, generally interfaces the CPU and the display driver circuitry, manages the exchange of graphics and/or video data between the frame buffer and the CPU and the display during display data update and screen refresh operations, controls frame buffer memory operations, and performs additional basic processing on the subject graphics or video data. For example, the display controller may also include the capability of performing basic operations such as line draws and polygon fills. The display controller is for the most part a slave to the CPU.

In current information processing systems, a number of key operations, such as data block transfers and display updates, are inefficiently performed because of limitations on the available system architectures and memory devices. As a result, system performance and pricing cannot be optimized. This is especially true in the case of state of the art systems operating at high clock rates and/or with high definition displays.

During a block transfer, an entire block of data is either moved or copied from a source area in memory to a destination area in memory. The transfer may be between the system memory and the frame buffer, within the system memory, or within the frame buffer. Block transfers operations can be performed by a "BLT (bit-block transfer) engine" within either the display controller or the CPU, or even by the CPU itself. Typically, the data is read from the source area of memory a word or byte at a time, and then written into the destination block of memory a word or byte at a time. This use of two operations (a read and a write) results in substantial inefficiencies, especially when the transfer crosses chip boundaries; not only are the number of required clock cycles doubled, but the bandwidth of the device interfaces and the interconnecting bus are diverted from other critical operations.

A similar problem occurs during display update operations. Generally, the CPU itself generates the display (graphics) data necessary to update the display screen when a display image change is required by user or the application software being run. Due to overhead constraints on the CPU, (as well as bandwidth limitations on PCI local bus and other buses within the system) and limits on the size of the display controller write buffer, the updated display data generated by the CPU is first stored in the system memory. When the display controller write buffer has capacity and CPU time is available, the CPU then reads back the required update information (typically both addresses to the frame buffer and pixel data) from the system memory via the core logic and the CPU local bus and then writes that data via the core logic and PCI local bus into the write buffer of the display controller. In other words, multiple CPU cycles (i.e., a read and a write cycle) are required to write each word of data to the display controller during a display update. This creates serious disadvantages when the efficient use of CPU cycles is critical to higher processing speeds and expanded performance and available bus bandwidth is constrained.

Another instance where transferring data can be problematic is during the operation of multiple asynchronous displays using a single display subsystem. This may occur for example when a single display controller and/or frame buffer are used to drive a CRT display requiring data at a first refresh rate and simultaneously an LCD display screen at a second refresh rate. The problem becomes even more difficult when the respective displays differ in size (number of pixels to be displayed).

Most currently available display subsystems, and in particular graphics subsystems, can simultaneously display the same information on both a CRT display and an LCD display. One instance where this situation occurs is when a portable PC with an LCD display is inserted into a "docking station" with a CRT display. Such systems are practical as long as: (1) the resolution of the displays is the same (i.e. 640×480 pixels) and (2) the refresh rates for both displays are the same. When the displays differ in size, some vertical or horizontal interpolation may be employed to expand or contract the images, as required, to fit the display screens. However, interpolation usually distorts the images, especially when graphics and text are mixed.

In an asynchronous system, the refresh rates for the two display devices differ. For example, the system CRT display might have a 72 Hz refresh rate and the LCD display might have a 60 Hz refresh rate. In this case a contention problem arises if the display controller attempts to drive both displays from the same frame buffer. Two frame buffers may be used to solve the contention problem and in addition allow the display controller to simultaneously generate different images on the respective displays. The two frame buffer approach however is more complex and expensive, since not only is additional memory required but also independent display data controls (e.g. FIFOs and DACs). Further, the use of two different frame buffers is inefficient since often data use overlaps; in current two display systems, the data is simply stored twice, once in each frame buffer.

Thus, the need has arisen for memory devices and systems and methods using the same which addresses each of the problems discussed above. In particular, such a memory devices, systems and methods should allow for efficient block transfers of data. Increased efficiency of display operations, such as display data updates, should also be addressed. Additionally, such memory devices, systems and methods should allow for the efficient generation of images on multiple displays.

SUMMARY OF THE INVENTION

In general, the principles of the present invention provide for the construction and operation of multiple bank memories. These memories include dynamic random access memory (DRAM) devices, static random access memory (SRAM) devices, and other types of memory devices. Generally, each memory includes multiple subarrays of columns of memory cells, the bitlines of which may be selectively coupled together by gating circuitry. This allows, among other things, for a bit of data to be transferred from one column of memory cells to another with only one gate delay. Further, the principles of the present invention allow for the two banks of memory to be operated asynchronously and independently.

According to a first embodiment of the principles of the present invention, a memory device is provided which includes a first column of memory cells having at least one conductive bitline and a second column of memory cells, also having at least one conductive bit line. A gate is provided for selectively coupling the bitline of the first column with the bitline of the second column for transferring a bit of data from a selected cell of the first column of cells to a selected cell of the second column of cells.

According to a second embodiment of the present invention, a memory subsystem is provided which includes first and second subarrays of memory cells. The memory cells of the first subarray are arranged in rows and columns, with each column associated with a conductive bitline and each row associated with a conductive word line. The second subarray is also arranged as rows and columns of cells, with each column of the second subarray associated with a conductive bitline and each row of the second subarray associated with a conductive word line. The memory subsystem also includes circuitry for coupling selected ones of the bit lines of the first subarray with corresponding ones of the bit lines of the second subarray.

According to a further embodiment of the principles of the present invention, a memory device is provided which includes a first subarray of rows and columns of dynamic random access memory cells, each column including a bitline and each row including a word line. A second subarray of rows and columns of dynamic random access memory cells is also provided, with each column including a bitline and each row including a word line. A first row decoder is provided for selecting a wordline in the first subarray in response to a first set of row addresses. A second row decoder is provided for selecting a wordline in the second subarray in response to a second set of row addresses. A first column decoder is provided for selecting at least one bitline in the first array in response to a first set of column addresses and a second column decoder is provided for selecting at least one bitline in the second subarray in response to a second set of column addresses. Finally, a plurality of gates is included for selectively coupling at least one bitline in the first subarray with at least one bitline in the second subarray.

The principles of the present invention are further embodied in processing systems. Once such processing system includes a memory device including a first array of memory cells arranged in rows and columns, each column associated with a conductive bitline and each row associated with a conductive word line. The memory device also includes a second subarray of memory cells arranged in rows and columns, each column associated with a conductive bitline and each row associated with a conductive word line. The memory device further includes circuitry for accessing at least one selected cell in the first subarray and circuitry for accessing at least one selected cell in the second subarray. Circuitry is provided for coupling a selected one of the bit lines of the first subarray with a selected one of the bit lines of the second subarray for transferring data from an accessed cell of the first subarray to an accessed cell of the second subarray. The processing system further includes a first display device for displaying data received from the first subarray and a second display device for displaying data from the second subarray.

The principles of the present invention are also embodied in methods for performing a block transfer in a memory subsystem, the memory subsystem including first and second subarrays of memory cells, each arranged in rows and columns, with each column associated with a conductive bitline and each row associated with a conductive word line, the memory further including a plurality of gates for coupling selected ones of the bitline of the first subarray with corresponding ones of the bitline for the second subarray. According to one method, a selected wordline in the first subarray is activated. Data at the bit lines of the first subarray from the cells of the selected row are sensed. Selected ones of the gates are activated to couple the sensed data from the corresponding bit lines of the first subarray to selected ones of the bit lines of the second subarray. A selected wordline of the second subarray is activated to write the data from the first subarray into the cells of a selected row of the second subarray.

Memory devices and systems and methods embodying the principles of the present invention have substantial advantages over the prior art. Among other things, the principles of the present invention provide for the efficient block transfer of data within a memory subsystem. Efficient block transfers in turn allow for optimization various display operations, such as display data updates, and block moves/ copies. Additionally, the principles of the present invention allow for the efficient generation of images on multiple displays, especially if such displays are being asynchronously refreshed a differing refresh rated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
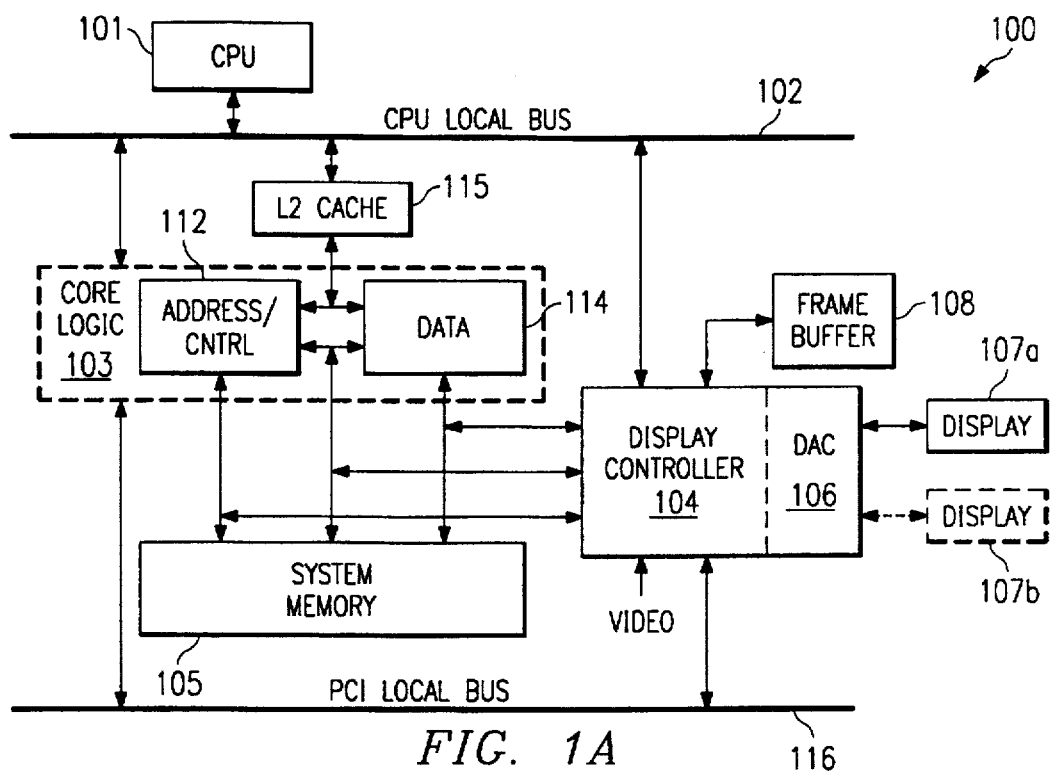
FIGS. 1A and 1B are high level functional block diagrams of exemplary information processing systems in which one or more memories embodying the principles of the present invention may be employed.
Figure 2A:
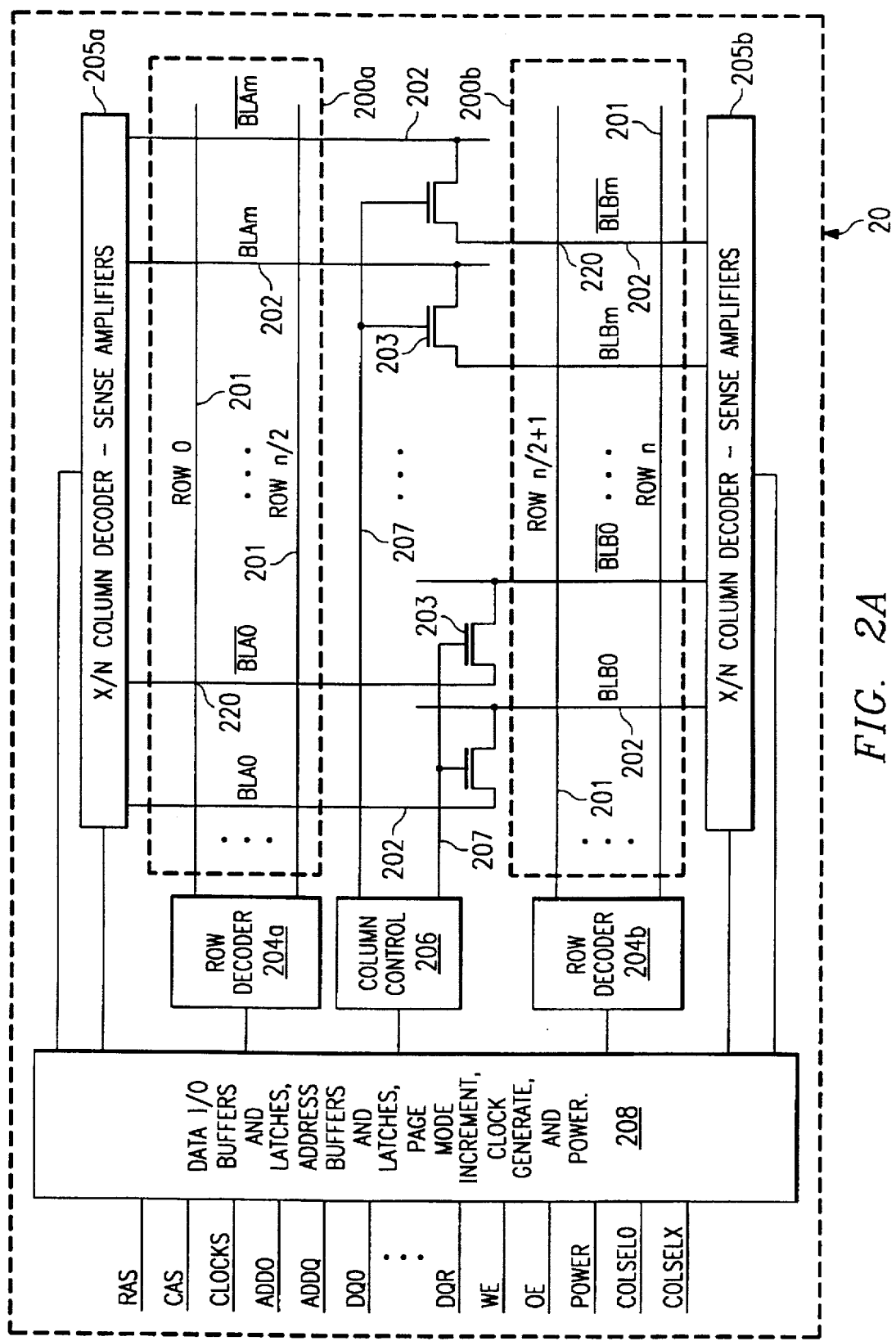
FIG. 2A is a functional block diagram of a first memory device embodying the principles of the present invention.
Figure 2B:
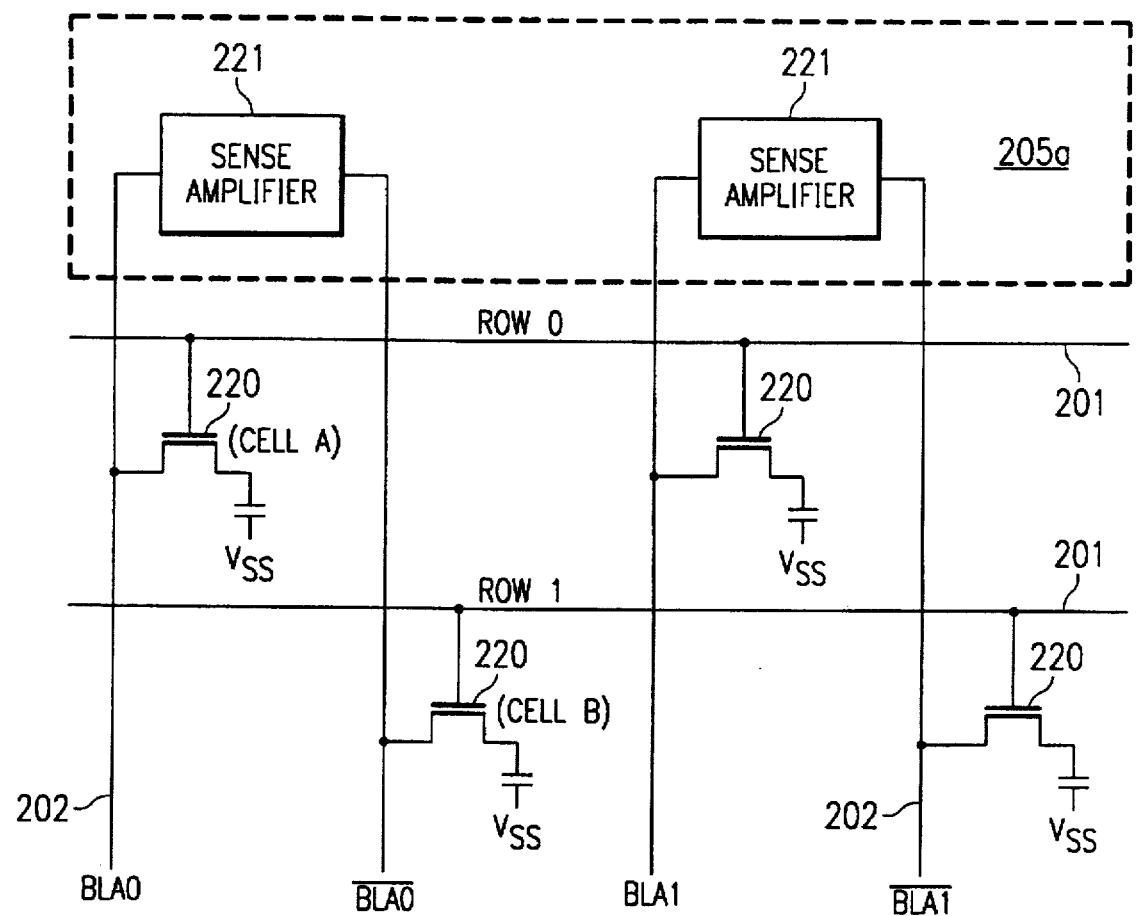
FIG. 2B is an enlarged portion of FIG. 2A showing selected circuitry of the embodiment of FIG. 2A in additional detail.
Figure 3:
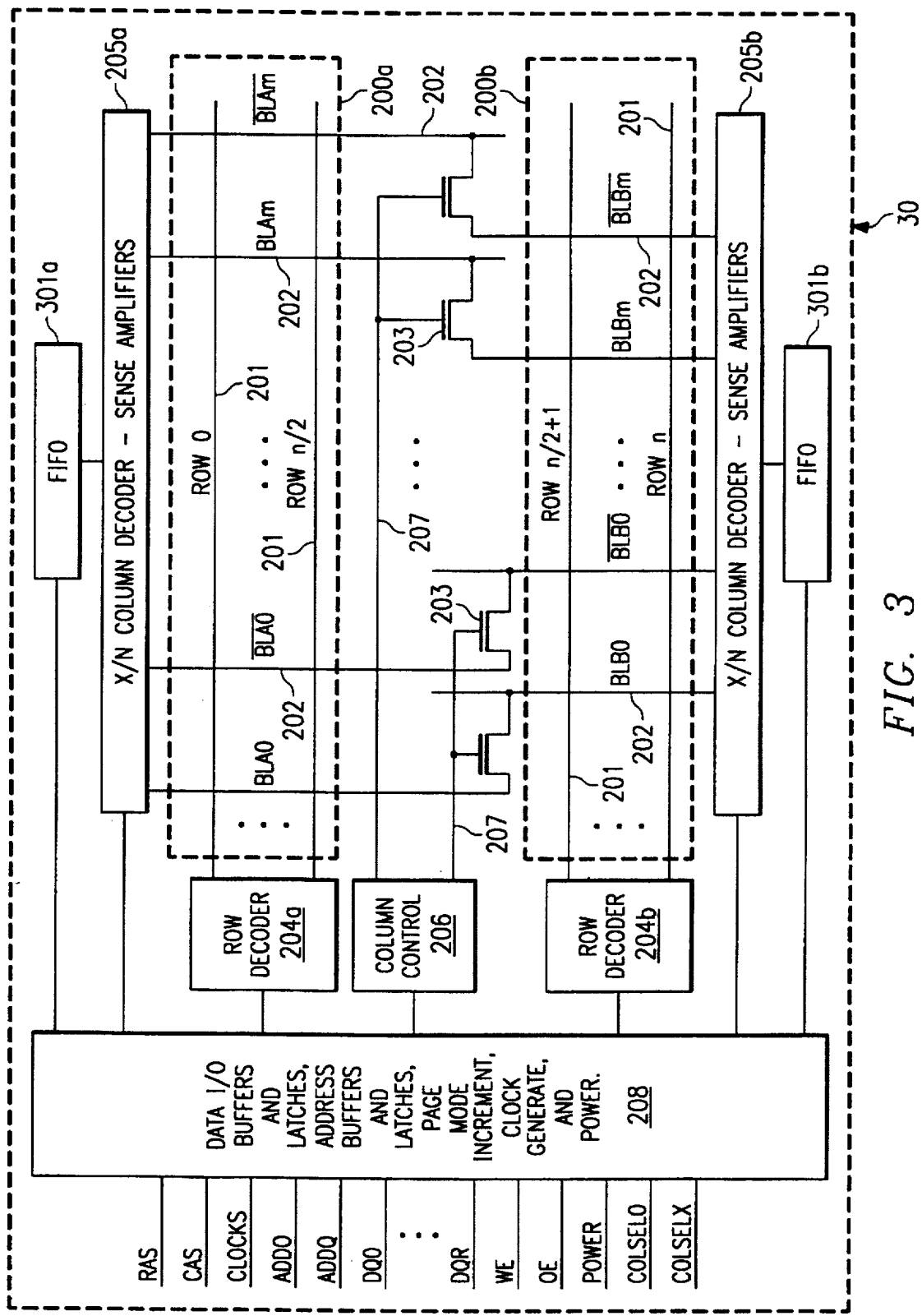
FIG. 3 is a functional block diagram of a second memory device embodying the principles of the present invention.

The principles of the present invention and their advantages are best understood by referring to the illustrated embodiment depicted in FIGS. 1–3 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108, a display device 107a and an optional display device 107b.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 KByte fast SRAM device(s). It should be noted that CPU 101 can also include on-board (L1) cache, typically up to 16 kilobytes.

Display controller 104 may be any one of a number of commercially available VGA display controllers. For example, display controller 104 may be one of the Cirrus Logic CL-GD754x series of display controllers. The structure and operation of such controllers is described in CL-GD754x Application Book, Rev 1.0, Nov. 22, 1994, and CL-GD7542 LCD VGA Controller Preliminary Data Book, Rev. 1.0.2, June 1994, both available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive displays 107a and 107b (when used) in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

As discussed further below, the principles of the present invention allow for two displays 107a and 107b to operate simultaneously even though their respective sizes and refresh rates differ. For example, display 107a may be an LCD portable PC display operating at a 60 Hz refresh rate and display 107b may be the CRT display of a docking system operating at 70 or 72 Hz.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

Figure 1B:
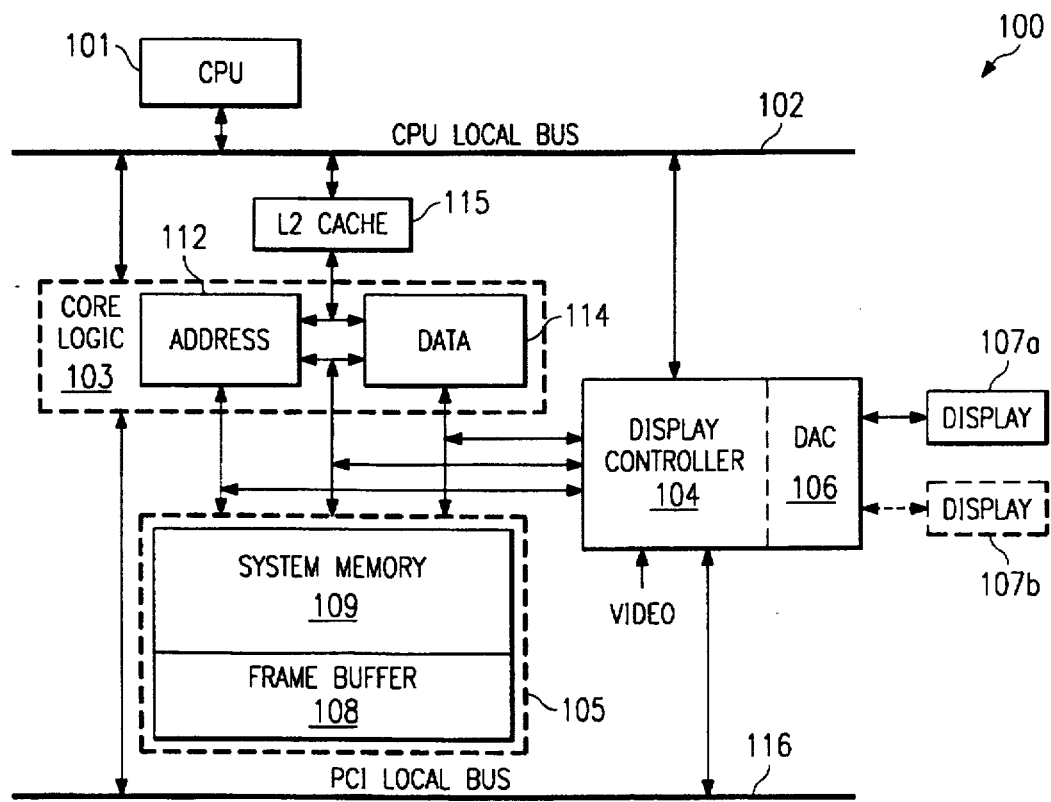

FIG. 1B is an alternate system architecture to which the principles of the present invention may advantageously applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

FIG. 2 is a functional block diagram of a memory 20 embodying the principles of the present invention. In the preferred embodiment, memory 20 is fabricated on single integrated circuit chip, although the present invention is not limited to single chip embodiments.

Memory 20 includes an array of n number of rows and m number of columns of memory cells partition into an upper bank or subarray 200a and a lower bank or subarray 200b. In the preferred embodiment, the memory cells are dynamic random access memory (DRAM) cells, although in alternate embodiments other memory devices, such as static random access memory (SRAM) cells, may be used.

Some of the fundamental principles of DRAM operation are described in: "A 64-k Dynamic RAM Needs Only One 5-volt Supply to Outstrip 16 k Parts", G. R. Mohan Rao and John Hewkin, Electronics, Sep. 28, 1978, pp. 109–116; "A 5-volt Only 64 k DRAM", L. S. White, N. H. Hong, D. J. Redwine, and G. R. Mohan Rao, International Solid State Circuit Conference 1980, Digest of Technical Papers, pp. 230–231; "A 1 Mb DRAM With Design-For-Test Functions," J. Neal, B. Holland, S. Inoue, W. K. Loh, H. McAdams and K. Poteet, International Solid State Circuit Conference 1986, Digest of Technical Papers, pp. 264–265; "A 4 Mb DRAM With Half Internal-Voltage Bitline Precharge", International Solid State Circuit Conference 1986, Digest of Technical Papers, pp. 270–271; "A Full Bit Prefetch Architecture For Synchronous DRAMs", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "DRAM Macros For ASIC Chips", IEEE Journal of Solid State Circuits, Vol 30., No. 9, September 1995, pp. 1006–1014, each incorporated herein by reference.

In the illustrated embodiment, subarray 200a includes rows 0 through n/2 and subarray 200b contains rows n/2+1 to n, although alternate row arrangements may be used. Each row is associated with a conductive wordline 201. The wordlines 201 of subarray 200a are coupled to and controlled by row decoder circuitry 204a and the wordlines 201 of subarray 200b are coupled to and controlled by row decoder circuitry 204b.

In the preferred embodiment, the columns of cells are arranged as pairs of folded bitlines 202, one for carrying "true logic" data from a selected cell and the other for carrying the complement of that data. In FIG. 2A, bitlines pairs BLA0/$\overline{BLA0}$ to BLAm/$\overline{BLAm}$ are contained within subarray 200a and bitline pairs BLB0/$\overline{BLB0}$ to BLBm/$\overline{BLBm}$ are contained with subarray 200b. The bitlines 202 of subarrays 200a and 200b are coupled to and controlled by corresponding column decoder/sense amplifier circuitry 205a and 205b. According to the principles of the present invention each block of circuitry 205 further includes at least one latch per bitline 202 for selectively latching data passed by the column decoders in response to column addresses.

FIG. 2B is a schematic diagram depicting in further detail representative pairs of the folded bitlines 202 of the preferred embodiment shown in FIG. 2A. A similar bitline/cell arrangement is applicable to the remainder of subarray 200a, as well as subarray 200b. In this case, the memory cells 220 are assumed to be DRAM cells. It should be noted that because of the sensing advantages of this configuration, discussed further below, folded bitlines are employed in the preferred embodiment, although in alternate embodiments other arrangements, such as open bitlines, may be used.

In the folded bitline configuration, the memory cells 220 of each bitline BLAx are coupled to a corresponding even numbered wordline 201 while each cell 220 of a "complementary" bitline $\overline{BLAx}$ is coupled a corresponding odd numbered wordline. As shown in FIG. 2B, a pair of exemplary cells 220 along even Row 0 are coupled to bitlines BLA0 and $\overline{BLA}$ and a pair of exemplary cells 220 along odd ROW 1 are coupled to bitlines $\overline{BLA0}$ and $\overline{BLA1}$ This pattern repeats itself throughout subarrays 200a and 200b.

Each bitline pair, such as bitlines BLA0 and $\overline{BLA0}$ and bitlines BLA1 and $\overline{BLA1}$ shown in FIG. 2B, are coupled to a sense amplifier 221. Sense amplifiers 221 sense difference the voltage between the bitlines BLAx and $\overline{BLAx}$ of the corresponding bitline pair. It should also be recognized that while the configuration of FIG. 2B does not employ a voltage reference for sensing, in alternate embodiments appropriate voltage reference circuitry known in the art (referenced previously) may also be included. The sense amplifiers then latch to either a full logic one or full a logic zero, depending on the sensed voltage swing. For example, assume that the cell 220 (cell A) at Row 0 and bitline BLA0 is be read (a write operation is similar, but instead data is impressed onto the bitlines and the cell capacitator). Bitlines BLA0 and $\overline{BLA0}$ are precharged to Vcc. (In alternate embodiments the bitlines may be precharged to Vss, with the voltages during accesses appropriately reversed.) The wordline 201 for Row 0 is set to an active (logic high) state by row decoder 204a. If cell A is storing a logic zero (i.e zero charge on the cell capacitor), the charge on the voltage on the bitline BLA0 capacitance is discharged relative to the charge on the capacitance of bitline $\overline{BLA0}$, which is at the precharge state of Vcc. The voltage swing is sensed by sense amplifier 221, which then latches BLA0 to a full logic 0 voltage and bitline $\overline{BLA0}$ to the complement, a full logic 1. On the other hand, if cell A is storing a logic 1, the cell capacitor charges up bitline BLA0 relative to bitline $\overline{BLA0}$; sense amplifier 221 latches bitline BLA0 to a logic 1 and bitline $\overline{BLA0}$ to the complement, a logic 0. It should be recognized that if a cell along Row 1 is being accessed, such as cell B, bitlines BLA0 and $\overline{BLA0}$ reverse roles. In this case, bitline $\overline{BLA0}$ is latched to the "true data value" and BLA0 latched to the complement.

According to the principles of the present invention, corresponding bitlines in arrays 200a and 200b can be selectively coupled together by gates 203 under the control of column control circuitry 206. As will be discussed in detail below, this configuration advantageously allows for the transfer of data from subarray 200a to subarray 200b with only a single gate delay per bit. In the preferred embodiment, gates 203 are field effect transistors having a source-drain path coupling the respective bitlines 202 and a gate coupled to control circuitry 206. While n-channel devices are shown in FIG. 2A, p-channel devices or more complex logic gates may be employed, depending on the desired logic and voltage polarities being implemented.

In the illustrated embodiment, bitline BLA0 of subarray 200a can be coupled to bitline BLB0 of subarray 200b, bitline $\overline{BLA0}$ to bitline $\overline{BLB0}$, and so on. At the opposite end of the array, bitline BLAm can be coupled to bitline BLBm and bitline $\overline{BLam}$ to bitline $\overline{BLBm}$. Preferably, bitlines 202 are controlled in pairs, such that when bitline BLA0 is coupled to bitline BLB0, bitline $\overline{BLA0}$ is simultaneously coupled to bitline $\overline{BLB0}$. Therefore, as illustrated in FIG. 2A, the gates of the corresponding gates 203 for each pair are coupled in common to column control circuitry 206 via the same control line 207. Column control circuitry 206 couples bitlines in subarray 200a with the corresponding bitlines in subarray 200b in response to control signals Colsel0–Colselx received through input/output and control circuitry 208.

Circuitry 208 also includes conventional data and address buffers and latches, clock generation circuitry, and page mode column address incrementation circuitry. Preferably, circuitry 208 latches in row addresses and column addresses address-serial from a multiplexed address bus in response to a row address strobe (RAS) and a column address strobe (CAS). In synchronous DRAM designs, a master clock dictates the basic DRAM operation.

The number of column control signals Colselx, as well as the number of control lines 207 between column control circuitry 206 and gates 203, required will depend on the control resolution required and the size of the cell array. For example, if subarrays 200a and 200b each have 512 pairs of columns of cells (a total of 1024 bitlines 202) and the ability to couple corresponding pairs of bitlines (i.e $\overline{BLAx/BLAx}$ to $\overline{BLBx/BLBx}$) on an individual basis is desired, 512 control lines 207 are needed between each pair of gates 203 and control circuitry 206 and the number of control signals Colselx will be 10 ($2^{10}$=1,024).

In the preferred embodiment, multiple pairs of bitlines $\overline{BLAx/BLAx}$ can be simultaneously coupled as a block to corresponding bitline pairs $\overline{BLBx/BLBx}$. This reduces the number of external control signals Colselx and reduces the number of control lines 207 on-chip. For example, assume that data is to be exchanged between subarrays in 64-bit blocks (64 bitline pairs or 128 bitlines) and that each subarray 200 includes 512 column pairs. In this case, only eight control lines 207 are required, each coupled to a corresponding 128 gates 203. The number of external control signals Colselx needed to select one of eight 64-bit block of columns correspondingly will be 3.

During conventional accesses (reads, writes, read-modify-writes, refreshes) all gates 203 are turned off. Row and column addresses are input word (address)—serial from an external source with RAS and CAS (memory 20 may also be a synchronous DRAM operating to a master clock). In one embodiment of memory 20, row decoders 204 operate in response to separate sets of row addresses and column decoders 205 operate in response to separate sets of column addresses. In this embodiment, address pins Add0–AddQ and data pins DQ0–DQR can be organized in either of two ways. First, separate subsets of address pins Add0–AddQ and separate subsets of data pins DQ0–DQR can be dedicated to the row decoder 204 and column decoder 205 associated with each subarray 200. Preferably, two sets of address and data latches would be provided in input/output circuitry 208, one per each subset of address and data pins. In this configuration, both arrays can be addressed and accessed simultaneously and independently through the corresponding address and data pin subsets, although address and data pin count would increase. Second, the address pins Add0–AddQ and data pins DQ0–DQR may be shared between subarrays 200a and 200b. Preferably, two sets of address and data latches would also be employed. In this case the address/data pin count is reduced, and accesses to the subarrays are "interleaved." During a given RAS cycle, row and column addresses to a first subarray 200 are latched-in circuitry 208 with RAS and CAS through address pins Add0–AddQ and the desired access made through data pins DQ0–DQR. Subsequently, an access to a second subarray 200 would be made by latching in the appropriate row and column addresses with RAS and CAS through address pins Add0–AddQ and the access made through data pins DQ0–DQR.

In a second embodiment, row decoders 204a and 204b lie in the same address space and respond to the same set of addresses received from an external source (e.g. core logic 103) In this case, a bank select signal is used to select to which subarray 200a or 200b the desired access is to be made. Preferably, the column decoders 205a and 205b also lie within the same column address space and thus respond to the same set of column addresses, although this is not a requirement of the present invention.

According to the principles of the present invention block transfers can optionally be performed in memory 20 as follows. Assume for discussion purposes that exchanges from one subarray 200 to another are made by 64-bit blocks. Also assume that the shared (multiplexed) address and data pins embodiment discussed above is used and that row decoders 204 are in separate address spaces, also as discussed above.

A first row and a first column address to a source block in the source subarray 200, assume for discussion the first 64 even bitlines BLA0–BLA64 of Row 0 of subarray 2000a, are received and latched by input/output circuitry 208 with RAS and CAS in a conventional fashion. Additionally, when RAS goes low, memory 20 transitions from the precharge to active cycle. All the cells of Row 0 are turned on and the data stored therein sensed latched by sense amplifiers 221.

In the present example, column decoder 205a responds to the first column address to source subarray 200a and selects the first 64 bitlines 202. The data on these 64 bitlines held by the corresponding sense amplifiers is passed by the column decoder and latched into the latches within column decoder/sense amplifiers 205a. RAS then returns to the precharge (logic high) state.

Next, a new RAS cycle is initiated and a second Row address is latched-in with the falling edge of RAS and a second column address latched-in with the falling edge of CAS. In the present example these addresses are to a location in destination subarray 200b. It should be noted that in the illustrated embodiment, the columns addressed in the source subarray correspond in row position to the columns addressed in the destination subarray such that data can be appropriately transferred therebetween when gates 203 are turned-on. For example, if the first 64 columns in the source subarray 200a are addressed in the first RAS then the first 64 columns in destination subarray 200b are addressed in the second RAS cycle.

Control signals Colselx are then received to couple together corresponding pairs of bitlines in subarrays 200a and 200b through gates 203. In this example, the selected gates 203 allow the 64 bits of latched data read from the addressed block in source subarray 200a during the first RAS cycle to be coupled through the corresponding bitlines 202 to the addressed block in destination subarray 200b during the second RAS cycle. The data is passed through in response to the destination column address to the latches in decoder/sense amplifier circuitry 200b. The wordline 201 of the addressed destination row is then activated. The voltages representing the latched data become impressed in the cells along the destination row for the selected columns to complete the block copy/move.

A second method of performing block transfers is possible in those embodiments where dedicated subsets of address pins are provided for each row decoder 204/subarray 200. In this case, row addresses to both subarrays 200a and 200b are simultaneously presented to address pins ADD0–ADDQ and latched-in with RAS. Subsequently, column addresses to both subarrays 200a and 200b are simultaneously received at address pins ADD0–ADDQ and latched-in with CAS.

Assuming again that subarray 200a is the source subarray and subarray 200b is the destination subarray, the block of data to be transferred is read from the addressed cells and latched in the latches of decoder/sense amplifier 205a, as discussed immediately above.

The wordline 201 of the selected row (Row 0) in the source subarray 200a is deactivated (pulled low). The gates 203 coupling the addressed columns in the source subarray 200a and the addressed columns in the destination subarray 200b are turned-on. The data from the cells in subarray 200a are transferred to the bitlines of subarray 200b and latched by the latches in column decoder/sense amplifiers 205b. The wordline 201 of the destination row is then activated (pulled high) and the data in the latches impressed into the capacitors of destination cells.

It should be noted that alternatively, the latching of data within the source and destination sense amplifiers/column decoder block 205 by latches may be foregone. In this case the sense amplifiers may maintain the voltage on the bitlines during wordline switching. Further, column decoding may be foregone and the gates 203 alone used to select bits for transfer.

To insure smooth operation, the physical structure of subarrays 200 should be substantially identical. Among other things, the cell density, row/column pitch, bitline length (hence bitline capacitance) and number of cells per row and column should be substantially the same. Smooth operation is also insured in embodiments using the folded bitline arrangement described above. In particular, folded bitlines allow better differential sensing and noise imunity between the complementary bitlines of each bitline pair even when voltage drops occur when a bitline in one subarray is coupled to a bitline to the other subarray during a block transfer. For example, assume that all bitlines are precharged to Vss. If logic one is read from a source cell, the associated bitline in latched by the associated sense amplifier to approximately Vcc. When the corresponding gate 203 couples the sourcing bitline to the destination bitline the voltage on the two bitlines is reduced to Vcc/2, assuming the capacitance for both bitlines is the same. After differential sensing between the destination bitline and the complementary bitline of its pair, the sense amplifiers of the destination subarray 200 pulls the voltage on the destination bitline, still at the precharge voltage Vss, back to Vcc. The problem becomes much simpler when the source bitline is carrying a logic zero since the precharge value Vss on the destination bitline is essentially the same. Similarly, if the bitlines 201 are precharged to Vcc or an intermediate voltage such as Vcc/2, the differential sensing insures that the transferred data is not impacted.

Memories embodying the principles of the present invention, such as memory 20, may advantageously be used in a number of systems applications. For example, memory 200 may be used as a display memory or frame buffer in a traditional architecture as shown in FIG. 1A. In this case, a block move of display data, such as when a display object is dragged across the screen with a mouse, can be implemented using the methods described above.

In the unified memory system of FIG. 1B, memory 20 can be employed to construct at least part of the unified memory at the boundary between the system memory and the frame buffer. For example, one subarray 200 would constitute a portion of the system memory to which display data would be written during an update. The other subarray would constitute some or all of the frame buffer. Hence, during an update, instead of reading the data out of the system memory and then writing the data to the frame buffer, that data is simply transferred across the system memory/frame buffer memory boundary through gates 203.

Memory 20, and in particular those embodiments discussed above which allow independent accessing to each subarray 200, is especially advantageous for use in systems employing multiple asynchronous displays. In this case, one subarray 200 services one display and the other subarray 200. FIG. 3 depicts a further embodiment, system 30, in which a pair of first-in-first-out memories (registers) 301 are provided for independently driving a pair of display devices. It should be noted that these FIFOs may also be used for queuing (pipelining) data during writes to the corresponding subarrays 200.

In each application of memory 20, not only can data transfer speed be optimized, but also memory space usage. For example, assume that the same data is required by two different associated devices, such as two asynchronous displays, then the data need only be stored in a single subarray and "shared" through gates 203. The share data may be for example stored in selected rows of subarray 200a and moved or copied into rows in subarray 200b as needed. In this fashion, wasted memory space can be substantially reduced or even eliminated.

Although the present invention and its advantages have been described in detail, it should be understood that various changes, substitutions and alterations can be made herein without departing from the spirit and scope of the invention as defined by the appended claims.

What is claimed is:

1. A memory comprising:
   a first plurality of columns of memory cells each including at least one conductive bitline;
   a second plurality of columns of memory cells each including at least one conductive bitline; and
   a plurality of gates organized in independently controlled groups for selectively coupling said bitlines of a selected group of said first plurality of columns with a group of said bitlines of said second plurality of columns for transferring a at least one bit of data from a selected cell of said first plurality of columns of cells to a selected cell of said second plurality of columns of cells.

2. The memory of claim 1 wherein each said gate comprises a field effect transistor.

3. The memory of claim 1 wherein said memory cells comprises dynamic random access memory cells.

4. The memory of claim 1 wherein said first column of cells comprises one of a plurality of columns of memory cells forming a first subarray and said second column of cells comprises one of a plurality of columns of cells forming a second subarray.

5. The memory of claim 4 wherein said first and second subarrays each comprise a plurality of rows of cells, each said row including a conductive wordline, a wordline of a said row of said first subarray controlled by a first row decoder and a wordline of a said row of said second subarray controlled by a second row decoder.

6. A memory subsystem comprising:
   a first subarray of memory cells arranged in rows and columns, each said column associated with a conductive bitline and each said row associated with a conductive wordline;
   a second subarray of memory cells arranged in rows and columns, each said column associated with a conductive bitline and each said row associated with a conductive wordline;

circuitry for independently coupling selected groups of said bitlines of said first subarray with corresponding groups of said bitlines of said second subarray;

a first column decoder coupled to said bitlines of said first subarray for randomly accessing selected cells along a selected row in said first subarray; and a second column decoder coupled to said bitlines of said second subarray for randomly accessing selected cells along a selected row in said second subarray.

7. The memory subsystem of claim 6 and further comprising column control circuitry operable to cause said circuitry for gating to coupled selected ones of said bitlines in response to a received control signal.

8. The memory of claim 6 wherein said bitlines of each of said first and second subarrays comprise folded bitlines.

9. The memory of claim 6 wherein said circuitry for coupling comprises a plurality of gates.

10. The memory of claim 9 wherein said plurality of gates comprises a plurality of field effect transistors.

11. The memory of claim 8 and further comprising control circuitry for causing said circuitry for coupling to couple a said bitline and a complementary said bitline of said first subarray with a said bitline and a complementary said bitline of said second subarray in response to a received control signal.

12. The memory of claim 6 and further comprising a first row decoder coupled to said wordlines of said first subarray and a second row decoder coupled to said wordlines of said second subarray.

13. The memory of claim 12 wherein said first and second row decoders respond to different address sets respectively.

14. The memory of claim 1 wherein said first and second column decoders respond to different address sets respectively.

15. The memory of claim 14 and further comprising a first first-in-first-out memory coupled to said first column decoder and a second first-in-first-out memory coupled to said second column decoder.

16. A memory device comprising:

a first subarray of rows and columns of dynamic random access memory cells, each said column including a bitline and each said row including a wordline;

a second subarray of rows and columns of dynamic random access memory cells, each said column including a bitline and each said row including a wordline;

a first row decoder for selecting a said wordline in said first subarray in response to a first set of row addresses;

a second row decoder for selecting a said wordline in said second subarray in response to a second set of row addresses;

a first column decoder for selecting at least one bitline in said first subarray for random access in response to a first set of column addresses;

a second column decoder for selecting at least one bitline in said second subarray for random access in response to a second set of column addresses;

a first plurality of gates for selectively coupling at least one bitline of a corresponding group of bitlines in said first subarray with at least one bitline of a corresponding group of bitlines in said second subarray, said first plurality of gates controlled by a first control signal; and a second plurality of gates for selectively coupling at least one bitline in a corresponding group of bitlines in said first subarray with at least one bitline of a corresponding group of bitlines in said second subarray.

17. The memory device of claim 16 wherein first set of row addresses is equivalent to said second set of row addresses.

18. The memory device of claim 16 wherein said first set of column addresses is equivalent to said second set of column addresses.

19. The memory device of claim 16 wherein said bitlines of said first and second subarrays comprise folded bitlines arranged in pairs of complementary bitlines, a sense amplifier shared by said complementary bitlines of a selected said pair.

20. The memory device of claim 16 and further comprising latching circuitry associated with said first subarray for temporarily latching data read from at least one cell in said first subarray during a transfer through at least one of said gates to a cell in said second subarray.

21. The memory device of claim 16 wherein said plurality of gates comprises a plurality of field effect transistors each having a current path coupling a said bitline in said first subarray with a said bitline in said second subarray.

22. The memory device of claim 16 wherein said plurality of gates are controlled by at least one control signal received from a source external to said memory device.

23. The memory device of claim 16 and further comprising a first FIFO coupled to said first column decoder and a second FIFO coupled to said second column decoder.

24. A processing system comprising:

a memory device including:

a first subarray of memory cells arranged in rows and columns, each said column associated with a conductive bitline and each said row associated with a conductive wordline;

a second subarray of memory cells arranged in rows and columns, each said column associated with a conductive bitline and each said row associated with a conductive wordline;

circuitry for randomly accessing at least one selected cell in said first subarray;

circuitry for randomly accessing at least one selected cell in said second subarray;

circuitry for coupling a selected one of said bitlines of said first subarray with a selected one of said bitlines of said second subarray for transferring data from an accessed cell of said first subarray to an accessed cell of said second subarray;

a first display device for displaying data received from said first subarray; and a second display device for displaying data received from said second subarray.

25. The processing system of claim 24 wherein said first and second display devices operate at different refresh rates.

26. The processing system of claim 24 wherein said circuitry for accessing a said cell in said first subarray and said circuitry for accessing a said cell in said second subarray are coupled to a single display controller.

27. The processing system of claim 24 wherein said circuitry for accessing a said cell in said first subarray and said circuitry for accessing a said cell in said second subarray are coupled to a single core logic chip set.

28. A method for performing a data transfer in a memory subsystem including a first subarray of memory cells arranged in rows and columns, each column associated with a conductive bitline and each row associated with a conductive wordline, a second subarray of memory cells arranged in rows and columns, each column associated with a conductive bitline and each row associated with a conductive wordline, and a plurality gates partitioned into at least two independently controllable groups, each group of gates for coupling selected ones of the bitlines of the first subarray with corresponding ones of the bitlines of said second subarray, the method comprising the steps of:

activating a selected wordline in the first subarray;

sensing data at the bitlines of the first subarray from the cells of the selected row;

activating a selected group of the gates to couple the sensed data from ones of the bitlines of the first subarray to selected ones of the bitlines of the second subarray; and activating a selected wordline of the second subarray to write the data from the first subarray into cells of a selected row and the columns associated with the selected bitlines of the second subarray.

29. The method of claim 28 and further comprising the step of latching the data at the bitlines of the first subarray after said step of sensing.

30. The method of claim 28 and further comprising the step of deactivating the selected wordline in the first subarray prior to said step of activating the selected wordline in the second subarray.

* * * * *

(12) EX PARTE REEXAMINATION CERTIFICATE (10196th)

United States Patent
Rao

(10) Number: US 5,687,132 C1
(45) Certificate Issued: Jun. 24, 2014

(54) MULTIPLE-BANK MEMORY ARCHITECTURE AND SYSTEMS AND METHODS USING THE SAME

(75) Inventor: G. R. Mohan Rao, Dallas, TX (US)

(73) Assignee: Intellectual Ventures II LLC, Wilmington, DE (US)

Reexamination Request:
No. 90/012,571, Sep. 14, 2012

Reexamination Certificate for:
Patent No.: 5,687,132
Issued: Nov. 11, 1997
Appl. No.: 08/548,752
Filed: Oct. 26, 1995

(51) Int. Cl.
*G11C 8/00* (2006.01)

(52) U.S. Cl.
USPC .................. 365/230.03; 365/221; 365/230.04

(58) Field of Classification Search
None
See application file for complete search history.

(56) References Cited

To view the complete listing of prior art documents cited during the proceeding for Reexamination Control Number 90/012,571, please refer to the USPTO's public Patent Application Information Retrieval (PAIR) system under the Display References tab.

*Primary Examiner* — My Trang Nu Ton

(57) ABSTRACT

A memory 20 is disclosed including a first column of memory cells including a conductive bitline 202 and a second column of memory cells also including a conductive bitline 202. A gate 203 is provided for selectively coupling the bitline 202 of the first column with the bitline 202 of the second column for transferring a bit of data from a selected cell of the first column to a selected cell of the second column.

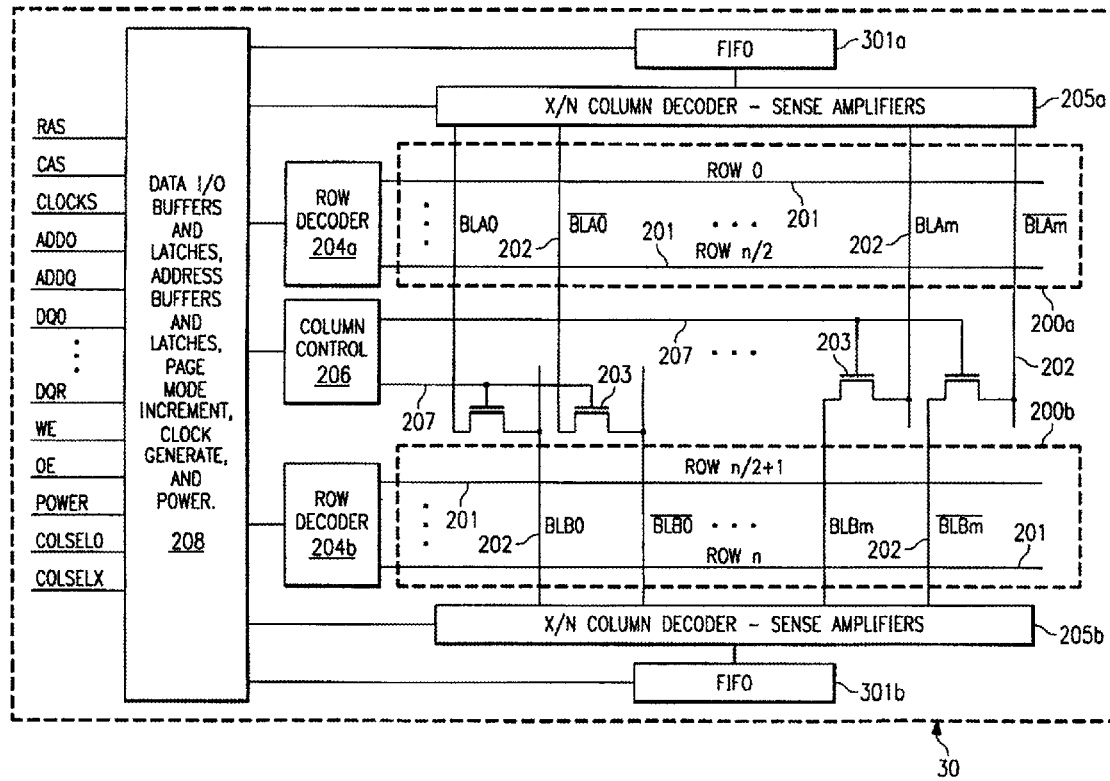

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 2, 4, 6, 9, 10, 28 and 29 is confirmed.

Claims 3, 5, 7, 8, 11-27 and 30 were not reexamined.

\* \* \* \* \*